US012593563B2

(12) United States Patent
Naganuma

(10) Patent No.: US 12,593,563 B2
(45) Date of Patent: Mar. 31, 2026

(54) DISPLAY DEVICE

(71) Applicant: Magnolia White Corporation, Tokyo (JP)

(72) Inventor: Tomohiko Naganuma, Tokyo (JP)

(73) Assignee: MAGNOLIA WHITE CORPORATION, Tokyo (JP)

( * ) Notice: Subject to any disclaimer, the term of this patent is extended or adjusted under 35 U.S.C. 154(b) by 506 days.

(21) Appl. No.: 18/096,570

(22) Filed: Jan. 13, 2023

(65) Prior Publication Data

US 2023/0240091 A1 Jul. 27, 2023

(30) Foreign Application Priority Data

Jan. 21, 2022 (JP) ................................. 2022-007732

(51) Int. Cl.
| | |
|---|---|
| *H10K 50/17* | (2023.01) |
| *H10K 50/16* | (2023.01) |
| *H10K 50/18* | (2023.01) |

(52) U.S. Cl.
CPC ........... *H10K 50/171* (2023.02); *H10K 50/16* (2023.02); *H10K 50/181* (2023.02)

(58) Field of Classification Search
CPC ........ H10K 50/15; H10K 50/16; H10K 50/17; H10K 50/18; H10K 50/171; H10K 50/181; H10K 59/122

USPC ........................................................... 257/40
See application file for complete search history.

(56) References Cited

U.S. PATENT DOCUMENTS

| | | | | |
|---|---|---|---|---|
| 2020/0066815 A1* | 2/2020 | Choi | .................... | H10K 59/173 |
| 2020/0127224 A1* | 4/2020 | Kanaya | ................ | H10K 59/122 |
| 2020/0312930 A1* | 10/2020 | Choi | ...................... | H10K 50/19 |
| 2025/0048855 A1* | 2/2025 | Yun | ...................... | H10K 59/353 |

FOREIGN PATENT DOCUMENTS

WO        2018/212960 A1    11/2018

* cited by examiner

*Primary Examiner* — Fazli Erdem
(74) *Attorney, Agent, or Firm* — XSENSUS LLP

(57) ABSTRACT

A display device includes a first pixel electrode, a second pixel electrode spaced apart from the first pixel electrode in a first direction, a first common layer on each of the first and second pixel electrodes, a second common layer on the first common layer, a first light-emitting layer on the first pixel electrode via the first and the second common layers, a second light-emitting layer on the second pixel electrode via the first and the second common layers, and a counter electrode on the first and second light-emitting layers, wherein the first common layer has a first region overlapping the first pixel electrode, a second region between the first and second pixel electrodes, and a third region overlapping the second pixel electrode, the second region is separated from each of the first and third regions, and the second common layer continuously covers the first, second, and third regions.

18 Claims, 13 Drawing Sheets

DISPLAY DEVICE

CROSS-REFERENCE TO RELATED APPLICATIONS

This application claims the benefit of priority to Japanese Patent Application No. 2022-007732, filed on Jan. 21, 2022, the entire contents of which are incorporated herein by reference.

FIELD

An embodiment of the present invention relates to a display device and a method of manufacturing thereof.

BACKGROUND

Conventionally, an organic EL display device (Organic Electro Luminescence Display) using an organic electroluminescence material (organic EL material) as a light-emitting element (organic EL element) of a display unit has been known as a display device. In recent years, there has been an increasing demand for higher definition in an organic EL display device.

As the resolution of an EL display device advances, a distance between pixels becomes closer, and therefore, the effect of a leakage current flowing between adjacent pixels (hereinafter, also referred to as "lateral leakage current") is actualized. In an EL display device, the lateral leakage current may cause the adjacent pixels to emit light, which may degrade the quality of the EL display device.

In order to suppress the occurrence of the lateral leakage current, it is disclosed that various processes are performed on an insulating layer functioning as a bank provided between adjacent pixel electrodes (Patent Literature 1: International patent publication No. WO2018/212960). In Patent Literature 1, for example, the side surfaces of the bank are processed into sharp tapered shapes or the side surfaces are processed into concavo-convex shapes. Parasitic light emission due to the lateral leakage current is suppressed by breaking the continuity of the organic layer including a light-emitting layer by the shape of the bank.

SUMMARY

A display device according to an embodiment of the present invention includes a first pixel electrode, a second pixel electrode spaced apart from the first pixel electrode in a first direction, a first common layer provided on each of the first pixel electrode and the second pixel electrode, a second common layer provided on the first common layer, a first light-emitting layer provided on the first pixel electrode via the first common layer and the second common layer, a second light-emitting layer provided on the second pixel electrode via the first common layer and the second common layer, and a counter electrode provided on the first light-emitting layer and the second light-emitting layer, wherein the first common layer has a first region overlapping the first pixel electrode, a second region between the first pixel electrode and the second pixel electrode, and a third region overlapping the second pixel electrode, the second region is separated from each of the first region and the third region, and the second common layer continuously covers the first region, the second region, and the third region.

A display device according to an embodiment of the present invention includes a first pixel electrode, a second pixel electrode spaced apart from the first pixel electrode in a first direction, an insulating layer between the first pixel electrode and the second pixel electrode, a first common layer provided on each of the first pixel electrode, the second pixel electrode, and the insulating layer, a second common layer provided on the first common layer, a first light-emitting layer provided on the first pixel electrode via the first common layer and the second common layer, a second light-emitting layer provided on the second pixel electrode via the first common layer and the second common layer, and a counter electrode provided on the first light-emitting layer and the second light-emitting layer, wherein the first common layer has a first region overlapping the first pixel electrode, a second region on the insulating layer, and a third region overlapping the second pixel electrode, the second region is separated from each of the first region and the third region, the insulating layer contacts a portion of a side surface of the first pixel electrode and a portion of a side surface of the second pixel electrode, and the second common layer continuously covers the first region, the second region, and the third region.

BRIEF DESCRIPTION OF DRAWINGS

FIG. 12 is a cross-sectional view in a display region of a conventional display device.

DESCRIPTION OF EMBODIMENTS

The shape of a bank described in Patent Literature 1 is complicated, and the number of manufacturing processes for processing the bank increase. In addition, in the case of increasing the definition of a display device, since the distance between adjacent light-emitting elements becomes smaller, if the shape of the bank becomes complicated, it is difficult to break the continuity of an organic layer.

According to an embodiment of the present invention, a display device is provided in which a lateral leakage current in a light-emitting element is suppressed by a simple structure.

Hereinafter, embodiments of the present invention will be described with reference to the drawings and the like. However, the present invention can be implemented in various aspects without departing from the gist thereof, and is not to be construed as being limited to the description of the embodiments exemplified below. In addition, in order to make the description clearer with respect to the drawings, although the width, thickness, shape, and the like of each portion may be schematically represented in comparison with actual embodiments, the schematic drawings are merely examples, and do not limit the interpretation of the present invention. Further, in this specification and the drawings, the same or similar elements as those described with respect to the above-described drawings are denoted by the same symbols, and redundant description may be omitted.

In the present invention, when a single film is processed to form a plurality of films, the plurality of films may have different functions and roles. However, the plurality of films is derived from films formed as the same layer in the same process, and have the same layer structure and the same material. Therefore, the plurality of films is defined as being present in the same layer.

In addition, in this specification, expressions such as "above" and "below" in describing the drawings represent a relative positional relationship between a structure of interest and other structures. In this specification, in a side view, a direction from an insulating surface to a light-emitting element, which will be described later, is defined as "above," and the opposite direction thereof is defined as "below." In this specification and claims, the expression "on" in describing the manner of arranging another structure on a certain structure shall include both arranging another structure directly above a certain structure and arranging another structure over a certain structure via yet another structure, unless otherwise specified.

First Embodiment

A display device according to an embodiment of the present invention will be described with reference to FIG. 1 to FIG. 8.

Figure 1:
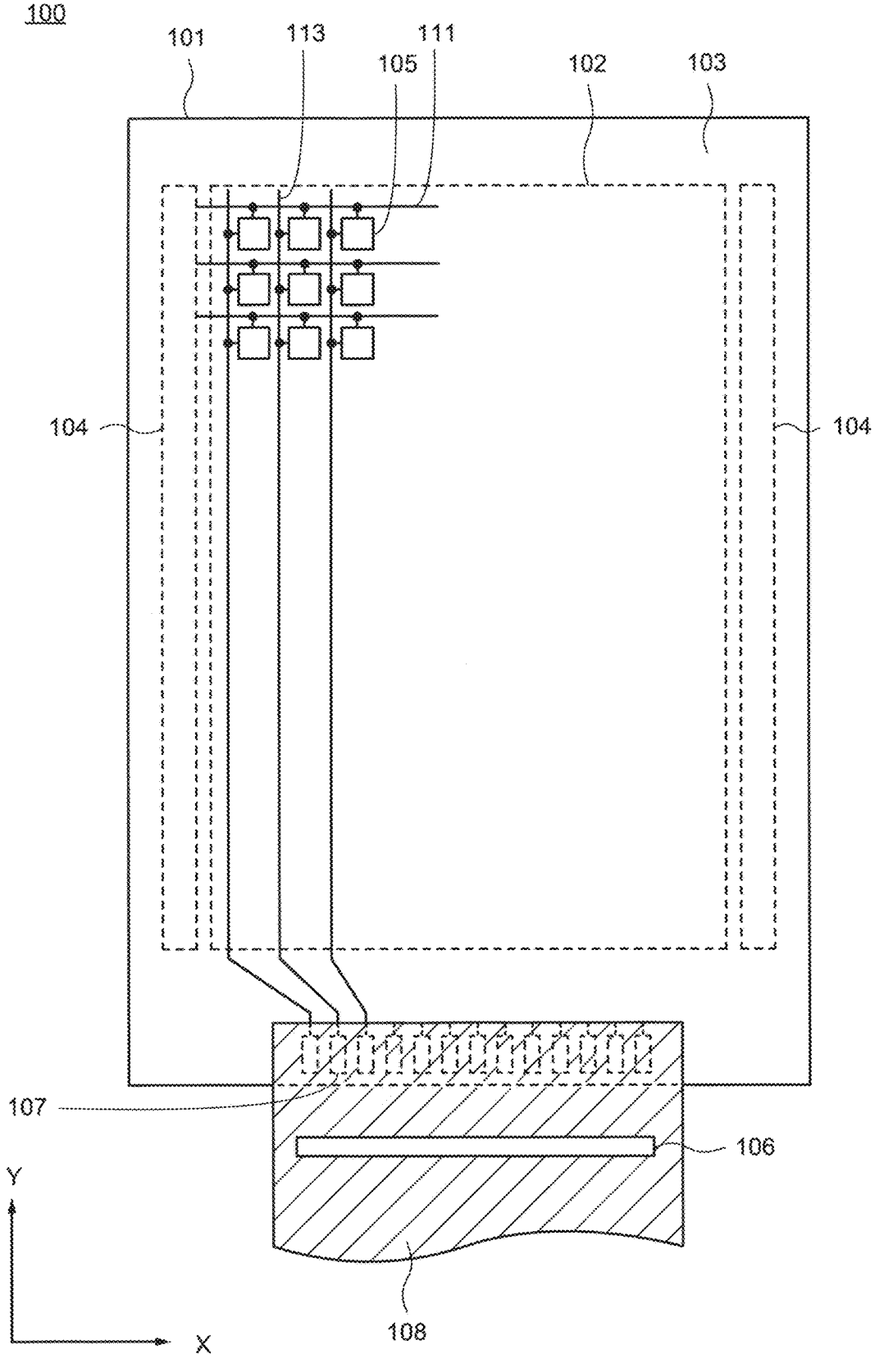
FIG. 1 is a schematic diagram when a display device according to an embodiment of the present invention is in a plan view.

FIG. 1 is a schematic diagram showing a structure of a display device 100 according to an embodiment of the present invention, and shows a schematic structure when the display device 100 is in a plan view. In this specification, a state in which the display device 100 is viewed from a direction perpendicular to a screen (display region) is referred to as a "plan view."

As shown in FIG. 1, the display device 100 includes a display region 102 formed on an insulating surface, a scan line drive circuit 104, a driver IC 106, and a terminal portion in which a plurality of terminals 107 is arranged. A light-emitting element having an organic layer composed of an organic material is arranged in the display region 102. In addition, a peripheral region 103 surrounds the display region 102. The driver IC 106 functions as a control unit that applies a signal to the scan line drive circuit 104 and a data line drive circuit. In addition to the driver IC 106, the data line drive circuit, a sampling switch or the like may be provided on a substrate 101. In addition, although the driver IC 106 is provided on a flexible printed circuit (Flexible Print Circuit: FPC) 108, it may be provided on the substrate 101. The flexible printed circuit 108 is connected to the plurality of terminals 107 provided in the peripheral region 103.

In this case, the insulating surface is the surface of the substrate 101. The substrate 101 supports each layer, such as an insulating layer and a conductive layer, provided on its surface. Also, the substrate 101 is made of an insulating material and may have an insulating surface, or other insulating films may be formed on the substrate 101 to form an insulating surface. The material of the substrate 101 and the material for forming the insulating film are not particularly limited as long as the insulating surface can be obtained.

The display region 102 shown in FIG. 1, a plurality of pixels 105 is arranged in a matrix in a direction X and a direction Y. The pixel can display one desired color in the display region 102. Each pixel 105 has a pixel circuit and a light-emitting element electrically connected to the pixel circuit. The light-emitting element includes a pixel electrode, an organic layer including a light-emitting layer stacked on the pixel electrode, and a counter electrode. For example, the pixel 105 emits a color of either a red light-emitting element, a green light-emitting element, or a blue light-emitting element. The color of the plurality of pixels 105 is not limited to the above, and may be at least one color or more. In this disclosure, a component included in a pixel that emits red is denoted by R, a component included in a pixel that emits green is denoted by G, and a component included in a pixel that emits blue is denoted by B. In addition, the emission peak-wavelength of the blue light-emitting element is 460 nm or more and 500 nm or less. The emission peak-wavelength of the red light-emitting element is 610 nm or more and 780 nm or less. The emission peak-wavelength of the green light-emitting element is 500 nm or more and 570 nm or less.

Each pixel 105 is electrically connected to a scan line 111 and a data line 113. Although not shown, each pixel 105 is electrically connected to a power supply line. The scan line 111 extends along the direction X and is electrically connected to the scan line drive circuit 104. The data line 113 extends along the direction Y and is electrically connected to the driver IC 106. In addition, the driver IC 106 outputs a scan signal to the scan line 111 via the scan line drive circuit 104. The driver IC 106 outputs a data signal corresponding to image data to the data line 113. It is possible to display according to image data when scanning and data signals are input to the pixel circuits of each of the pixel 105. The pixel circuit is made up of a plurality of transistors. Typically, a thin film transistor (Thin Film Transistor: TFT) can be used as the transistor. However, the present invention is not limited to the thin film transistor, any element having a current control function can be used, not limited to thin-film transistors.

Figure 2:
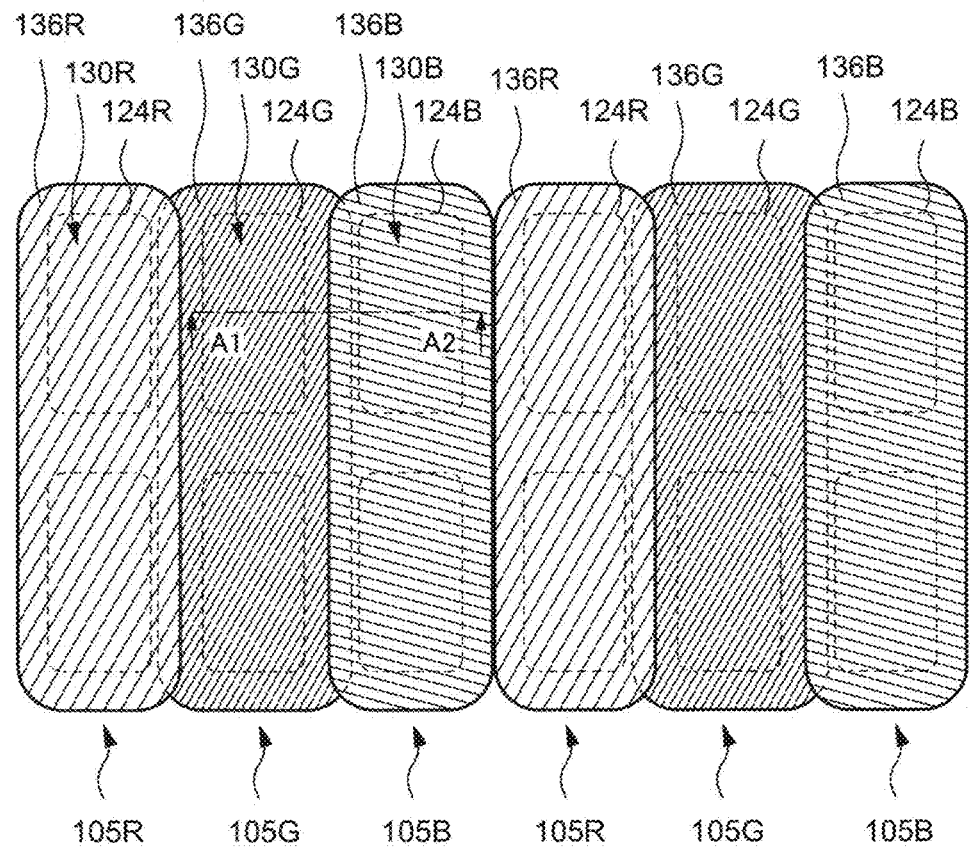
FIG. 2 is an enlarged view of a pixel layout when a display region of a display device is in a plan view.
Figure 2:
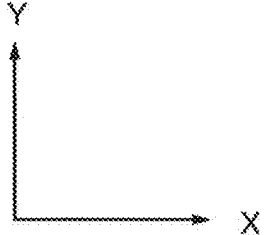
Figure 3:
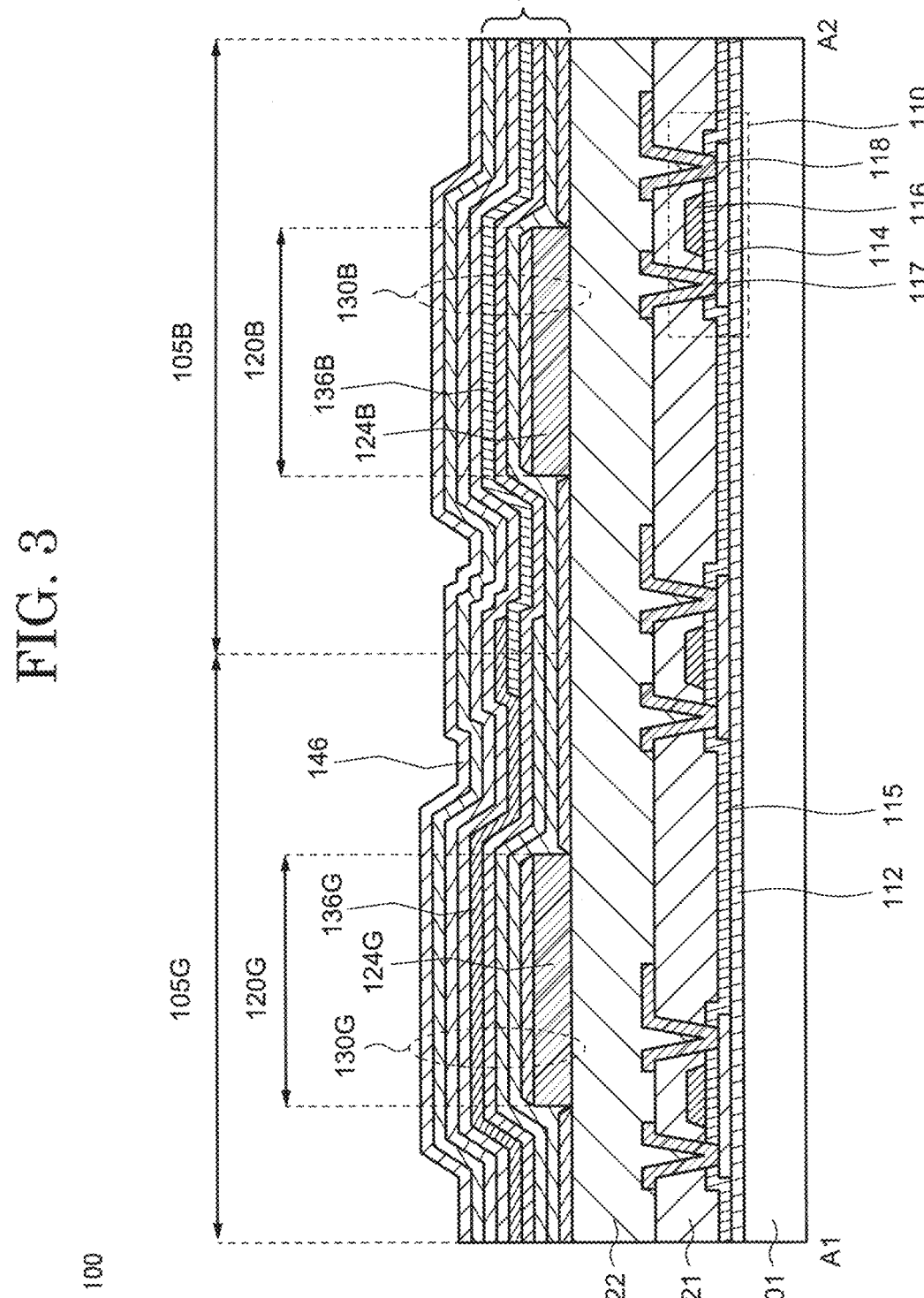
FIG. 3 is a cross-sectional view when a display region of a display device shown in FIG. 2 is cut along a line A1-A2.
Figure 4:
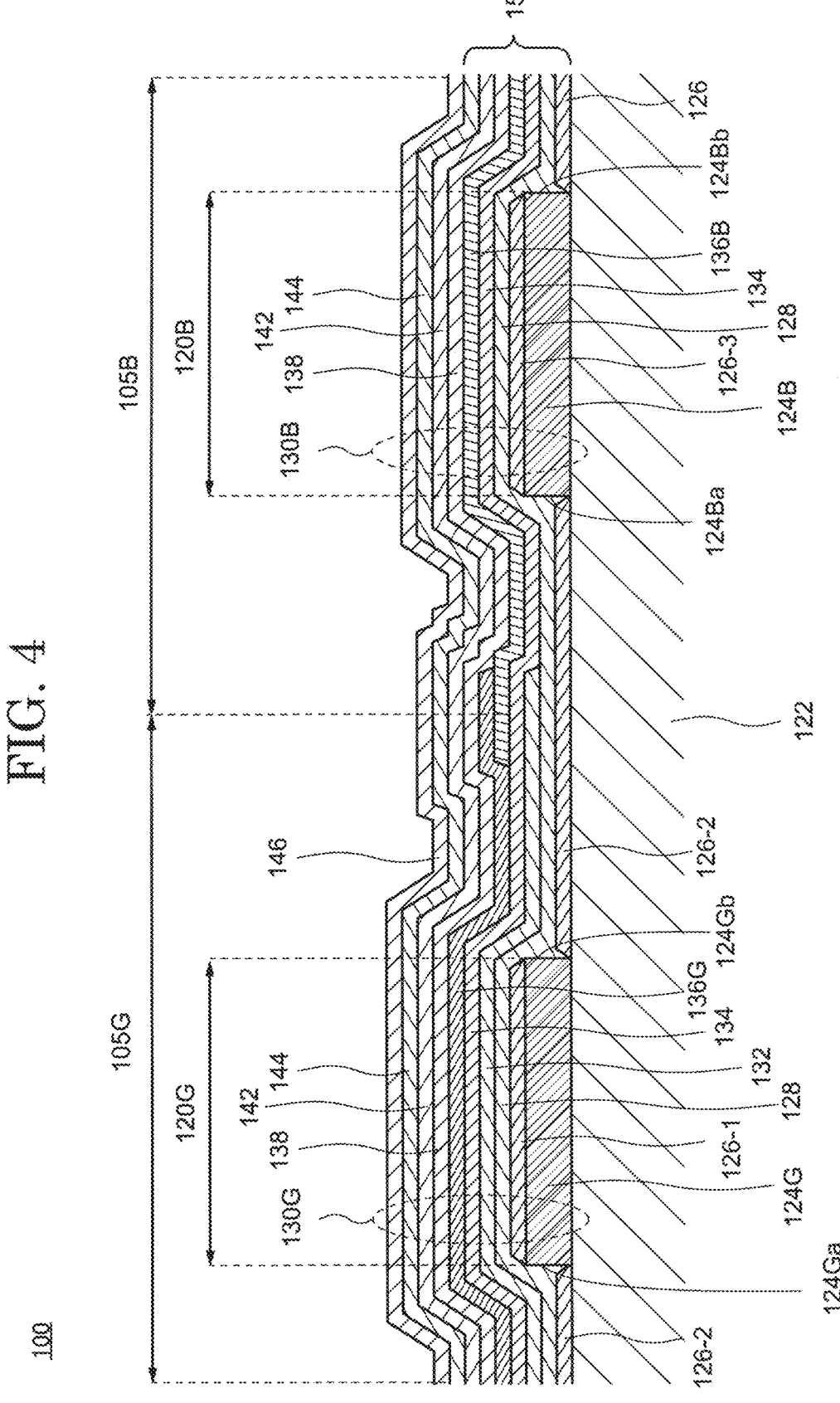
FIG. 4 is an enlarged view of a portion of the cross-sectional view shown in FIG. 3.

FIG. 2 is an enlarged view of a pixel layout when the display device 100 is in a plan view. FIG. 2 shows a case where one red pixel 105R, one green pixel 105G, and one blue pixel 105B are used as a unit and provided in stripes by each color. FIG. 3 is a cross-sectional view when the pixel layout shown in FIG. 2 is cut along a line A1-A2. FIG. 4 is an enlarged view of a portion of the cross-sectional view shown in FIG. 3. In the present embodiment, a structure of a top-emission display device will be described.

FIG. 2 shows a region where the pixels 105R, 105G, and 105B are arranged. The pixel 105R, the pixel 105G, and the pixel 105B are provided side by side in the direction X. In FIG. 2, regions indicated by solid lines are regions where light-emitting layers 136R, 136G, and 136B are provided. In addition, regions surrounded by dotted lines are regions where pixel electrodes 124R, 124G, and 124B are arranged. The regions where the pixel electrodes 124R, 124G, and 124B are provided correspond to light-emitting regions when light-emitting elements 130R, 130G, and 130B actually emit light. If each of the light-emitting elements 130R, 130G, and 130B is not distinguished, they will be described as the light-emitting element 130. In addition, the same applies to each component of the light-emitting elements 130R, 130G, and 130B.

FIG. 3 is a cross-sectional view when the display device 100 shown in FIG. 2 is cut along a line A1-A2. FIG. 3 shows cross sections of the pixel 105G and the pixel 105B. A plurality of transistors 110 is provided on the substrate 101 via an insulating film 112. A pixel circuit is configured by the plurality of transistors 110. The transistor 110 is composed of at least a semiconductor layer 114, a gate insulating film 115, and a gate electrode 116. An interlayer insulating film 121 is provided on the transistor 110. A source electrode or drain electrode 117, 118 is provided on the interlayer insulating film 121. Each of the source electrode or drain electrode 117, 118 is connected to the semiconductor layer 114 via a contact hole provided in the interlayer insulating film 121 and the gate insulating film 115. An insulating film 122 is provided as a flattening film on the interlayer insulating film 121. An unevenness caused by the transistor 110 and the source electrode or drain electrode 117, 118 can be relieved by the insulating film 122. The plurality of transistors 110 provided on the substrate 101 and the interlayer insulating film 121 and the insulating film 122 provided on the transistor 110 are formed by known materials and methods. In FIG. 4 and subsequent figures, the structure of the pixel circuit provided below the insulating film 122 is omitted.

The light-emitting element 130G is provided in the pixel 105G, and the light-emitting element 130B is provided in the pixel 105B on the insulating film 122. The light-emitting element 130G has at least the pixel electrode 124G, the light-emitting layer 136G, and a counter electrode 146. The light-emitting element 130B has at least the pixel electrode 124B, the light-emitting layer 136B, and the counter electrode 146.

In the display device 100 of the present embodiment, the pixel electrode 124 functions as an anode constituting the light-emitting element 130. Although not shown in FIG. 3, the pixel electrode 124 is electrically connected to the transistor 110. The pixel electrode 124 may be configured differently, either top-emission or bottom-emission. For example, in the case of the top-emission type, a highly reflective metal film is used as the pixel electrode 124. A stacked structure of a transparent conductive layer with a high work function such as an indium-oxide-based transparent conductive layer (e.g., ITO) or a zinc-oxide-based transparent conductive layer (e.g., IZO, ZnO) and a metal film is used as the pixel electrode 124. On the other hand, in the case of the bottom-emission type, the transparent conductive layer described above is used as the pixel electrode 124. In the present embodiment, a top-emission type organic EL display device will be exemplified.

An organic layer 150 is provided on the insulating film 122 and the pixel electrodes 124G and 124B. The organic layer 150 includes the light-emitting layer 136 composed of an organic material and functions as a light-emitting portion of the light-emitting element 130. The organic layer 150 has various layers (also referred to as common layers) such as a hole injection layer and/or a hole transport layer, an electron injection layer and/or an electron transport layer, in addition to the light-emitting layer 136. The common layer will be described in detail later.

The counter electrode 146 is provided on the organic layer 150. The counter electrode 146 functions as a cathode constituting the light-emitting element 130. Since the display device 100 of the present embodiment is of the top-emission type, a transparent electrode is used as the counter electrode 146. An MgAg thin film or a transparent conductive layer (ITO or IZO) is used as a thin film constituting the transparent electrode. The counter electrode 146 is provided on the entire display region 102 on each pixel 105R, 105G, and 105B. The counter electrode 146 is electrically connected to an external terminal via the underlying conductive layer in the peripheral region 103 near an end portion of the display region 102.

Next, various layers included in the organic layer 150 will be described with reference to FIG. 4. FIG. 4 is an enlarged cross-sectional view of the pixel 105G and the pixel 105B. In FIG. 4, the light-emitting element 130G and the light-emitting element 130B are provided above the insulating film 122.

For example, the film thickness of the pixel electrodes 124G and 124B is 100 nm or more and 250 nm or less. A common layer 126, a common layer 128, a common layer 132, and a common layer 134 are provided on the pixel electrode 124G. In the present embodiment, it is assumed that the common layer 126 is a hole injection layer (HIL), the common layer 128 and the common layer 132 are hole transport layers (HTL), and the common layer 134 is an electron-blocking layer (EBL). The light-emitting layer 136G is provided on the pixel electrode 124G via the common layer 126, the common layer 128, the common layer 132, and the common layer 134. A common layer 138, a common layer 142, and a common layer 144 are provided on the light-emitting layer 136G. In the present embodiment, the common layer 138 is a hole-blocking layer (HBL), the common layer 142 is an electron transport layer (ETL), and the common layer 144 is an electron injection layer (EIL).

The common layer 126, the common layer 128, and the common layer 134 are provided on the pixel electrode 124B. The light-emitting layer 136B is provided on the pixel electrode 124B via the common layer 126, the common layer 128, and the common layer 134. The common layer 138, the common layer 142, and the common layer 144 are provided on the light-emitting layer 136B. The common layer 132 is omitted from the light-emitting element 130B. The optical path length can be adjusted by changing the film thickness of the hole transport layers for each of the light-emitting elements 130G and 130B. As a result, only light with a wavelength that matches the optical path length can be resonated and emphasized, and the light with a wavelength whose optical path length is shifted can be attenuated. Therefore, the spectrum of the light extracted to the outside becomes high intensity, and the brightness and color purity are improved.

Figure 12:
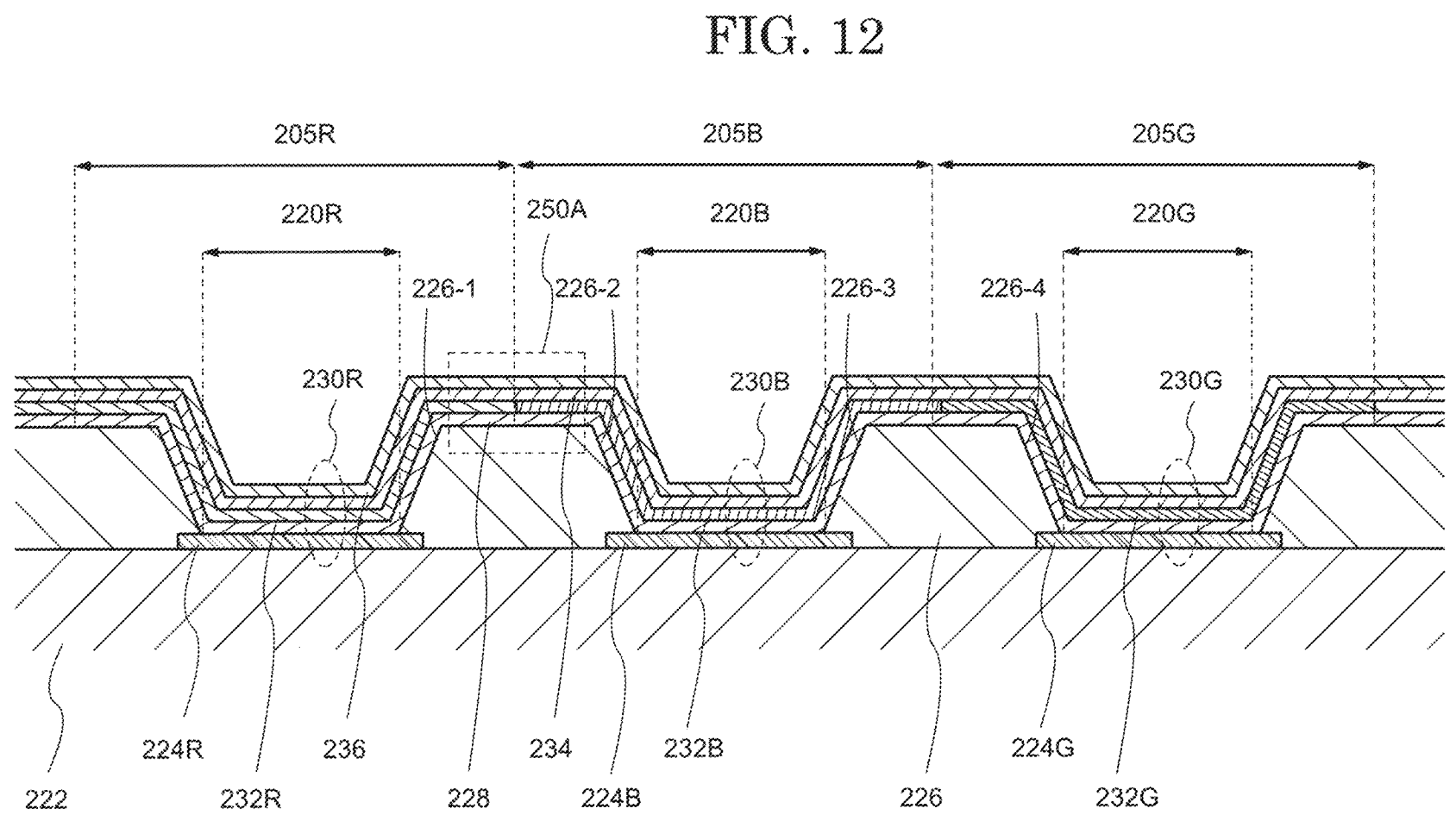
Figure 13:
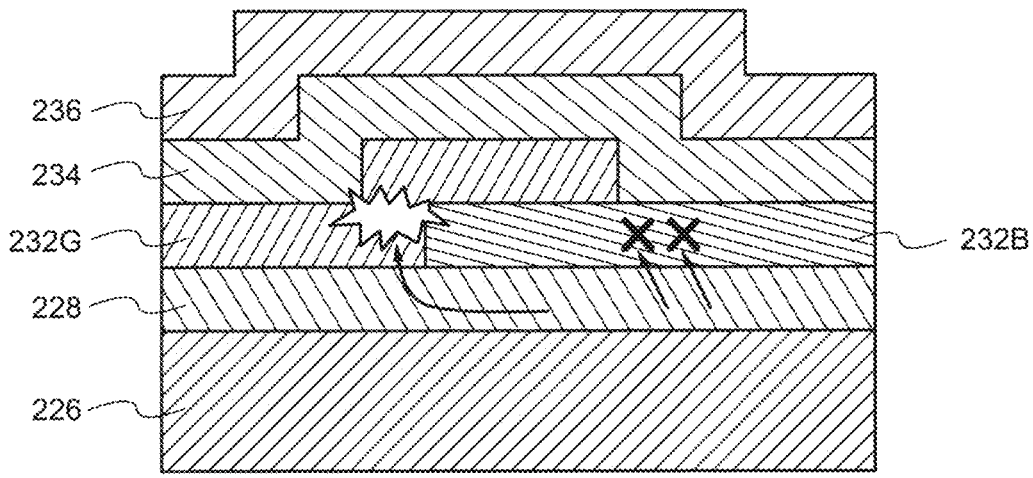
FIG. 13 is an enlarged view of a portion of the cross-sectional view shown in FIG. 12.

FIG. 12 is a cross-sectional view when a display region in the conventional display device is cut. In addition, FIG. 13 is an enlarged view of a portion of a cross-sectional view shown in FIG. 12.

FIG. 12 shows cross-sectional views of the pixel 205R, 205G, and 205B. On an insulating film 222, a light-emitting element 230R is provided in the pixel 205R, a light-emitting element 230G is provided in the pixel 205G, and a light-emitting element 230B is provided in the pixel 205B. The light-emitting element 230R has at least a pixel electrode 224R, a light-emitting layer 232R, and a counter electrode 236. The light-emitting element 230G has at least a pixel electrode 224G, a light-emitting layer 232G, and the counter electrode 236. The light-emitting element 230B has at least a pixel electrode 224B, a light-emitting layer 232B, and the counter electrode 236. A common layer 228 is provided between the pixel electrodes 224R, 224G, and 224B and the light-emitting layers 232R, 232G, and 232B. A common layer 234 is provided between the light-emitting layers 232R, 232G, and 232B and the counter electrode 236. The common layers 228 and 234 are provided in common over the light-emitting elements 230R, 230G, and 230B (over the display region). In FIG. 12 and FIG. 13, the pixel electrodes 224R, 224G, and 224B are anodes and the counter electrode 236 is a cathode. Therefore, the common layer 228 includes at least one of the hole transport layer and the hole injection layer, and the common layer 234 includes at least one of the electron transport layer and the electron injection layer.

In order to suppress unintended light emission in the adjacent pixels, the regions where the light-emitting layer is provided are separated so as not to overlap. However, in order for the regions where the light-emitting layer is provided to be formed so as not to overlap, openings 220R, 220G, and 220B need to be formed sufficiently apart from each other, and the definition is deteriorated.

As the definition of the display region is increased, the regions where the light-emitting layer is provided overlap each other. For example, as shown in FIG. 12 and FIG. 13, a part of the light-emitting layer 232B and a part of the light-emitting layer 232R overlap each other in the region where the pixel 205B and the pixel 205R are adjacent to each other.

FIG. 13 shows an enlarged view of a region 250A where the pixel 205B and the pixel 205G are adjacent to each other. The light-emitting layer 232B and the light-emitting layer 232G are provided via the common layer 228 on the insulating layer 226. A portion of the light-emitting layer 232B overlaps a portion of the light-emitting layer 232G. Generally, the emission starting voltage of the light-emitting layer 232B is greater than the emission starting voltages of the light-emitting layer 228R and the light-emitting layer 232G. Therefore, when the light-emitting element 230B is allowed to emit light, a large voltage is applied to the light-emitting layer 232B so that the holes in the common layer 228 move from the pixel 205B toward the pixel 205G in the transverse direction. The lateral transport of the holes is due to the low lateral resistance of the hole transport layer in the common layer 228. Therefore, the light-emitting layer 232G emits light at an end portion of the light-emitting layer 232G. According to the light emission of the light-emitting layer 232B, there is a problem that the colors are mixed due to unintended light emission of the light-light-emitting layer 232G. In this disclosure, a portion where unintended light emission occurs in the light-emitting layer 232R or the light-emitting layer 232G adjacent to the light-emitting layer 232B is referred to as a starting point of light emission. Also, the emission starting voltage of the light-emitting layer 232R and the emission starting voltage of the light-emitting layer 232G are approximately the same. Therefore, even if the light-emitting element 230G is allowed to emit light, the holes in the common layer 228 are suppressed from moving in the transverse direction from the pixel 205G to the pixel 205R and the pixel 205B. Therefore, the end portion of the light-emitting layer 232G and the light-emitting layer 232R do not emit light in the region where the end portion of the light-emitting layer 232G and the end portion of the light-emitting layer 232R overlap.

As described above, since the emission starting voltages of the light-emitting layers 232R, 232G, and 232B are different from each other, when the light-emitting layer 232B and the adjacent light-emitting layers 232R and 232G overlap each other, a lateral leakage current is generated, and the light-emitting layer emits light in an unintended region. In order to suppress unintended light emission in each light-emitting layer, the shape of the side surface of the insulating layer 226 functioning as a bank may be processed into a sharp tapered shape, or the side surface may be processed into an uneven shape. However, the shapes of the insulating layer 226 as described above are complicated, and the number of manufacturing processes for processing the insulating layer 226 increases. In addition, since the distance between adjacent light-emitting elements becomes smaller when the definition of the display device is increased, if the shape of the insulating layer 226 becomes complicated, it becomes difficult to break the continuity of the organic layer. As described above, conventionally, it has been difficult to prevent unintentional light emission due to a lateral leakage current with a simple structure.

Therefore, in the display device 100 according to an embodiment of the present invention, the common layer 126 that causes the lateral leakage current is divided. Specifically, the common layer 126 is cut by the end portion of the pixel electrode 124. Accordingly, the common layer 126 is not formed on side surfaces 124Ga and 124Gb of the pixel electrode 124G and side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 126 can be separated into a common layer 126-1 (also referred to as a first region) provided on the pixel electrode 124G, a common layer 126-3 (also referred to as a third region) provided on the pixel electrode 124B, and a common layer 126-2 (also referred to as a second region) provided between the pixel electrode 124G and the pixel electrode 124B. That is, the common layer 126 is separated into the common layers 126-1 and 126-3 provided in the region overlapping the pixel electrodes 124G and 124B and the common layer 126-2 provided in the region not overlapping the pixel electrodes 124G and 124B.

The common layer 128 is provided on the common layers 126-1 to 126-3. The common layer 128 may continuously cover the divided common layers 126-1, 126-2, and 126-3. The common layer 128 may not be in contact with the side surfaces 124Ga and 124Gb of the pixel electrode 124G or the side surfaces 124Ba and 124Bb of the pixel electrode 124B.

The lateral resistance of the common layers 126-1 and 126-3 and the common layer 128 increases by dividing the common layer 126 which causes the lateral leakage current by the pixel electrode 124. As a result, it is possible to suppress the holes from flowing from the common layers 126-1 and 126-3 to the common layer 128. Therefore, at the border between the green pixel 105G and the blue pixel 105B, it is possible to suppress color mixing due to unintended light emission of the light-emitting layer 136G due to the light emission of the light-emitting layer 136B.

In addition, in the present embodiment, a bank that is usually provided between the adjacent pixel electrodes 124 can be omitted. In order to divide the common layer 126 into a plurality of regions, the common layer 126 only needs to be cut by the upper end of the pixel electrode 124. Therefore, it is possible to provide a display device in which the lateral leakage current in the light-emitting element is suppressed with a simple structure.

Although not shown in FIG. 3 and FIG. 4, a sealing film may be provided on the light-emitting elements 130R, 130G, and 130B. The sealing film is configured by combining an inorganic insulating film and an organic insulating film. Providing the sealing film makes it possible to suppress moisture from entering into the organic layer 150 including the light-emitting layer 136 of the light-emitting elements 130R, 130G, and 130B.

<Manufacturing Method of Display Device>

Next, a manufacturing method of the display device 100 will be described with reference to FIG. 5 to FIG. 7.

Figure 5:
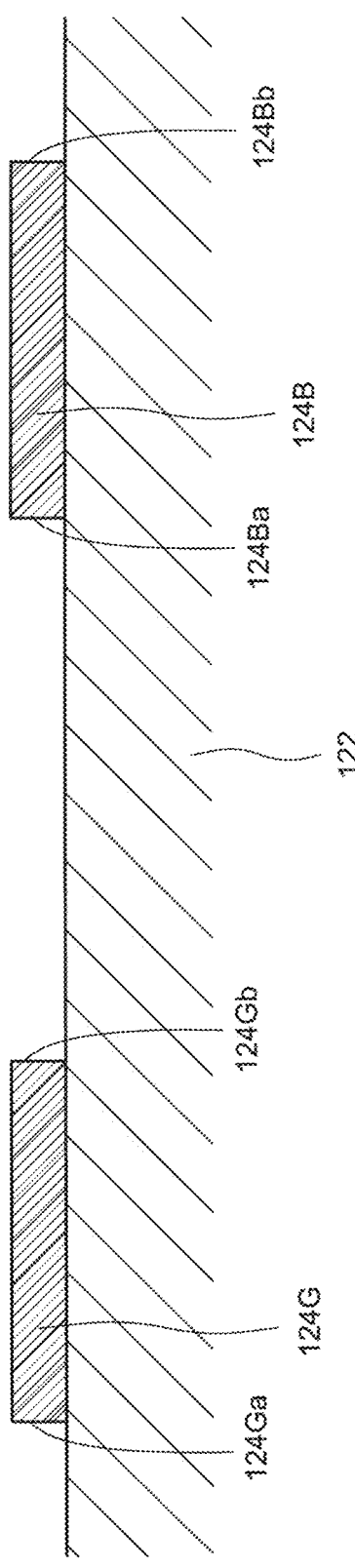
FIG. 5 is a cross-sectional view illustrating a manufacturing method of a display device according to an embodiment of the present invention.
Figure 6:
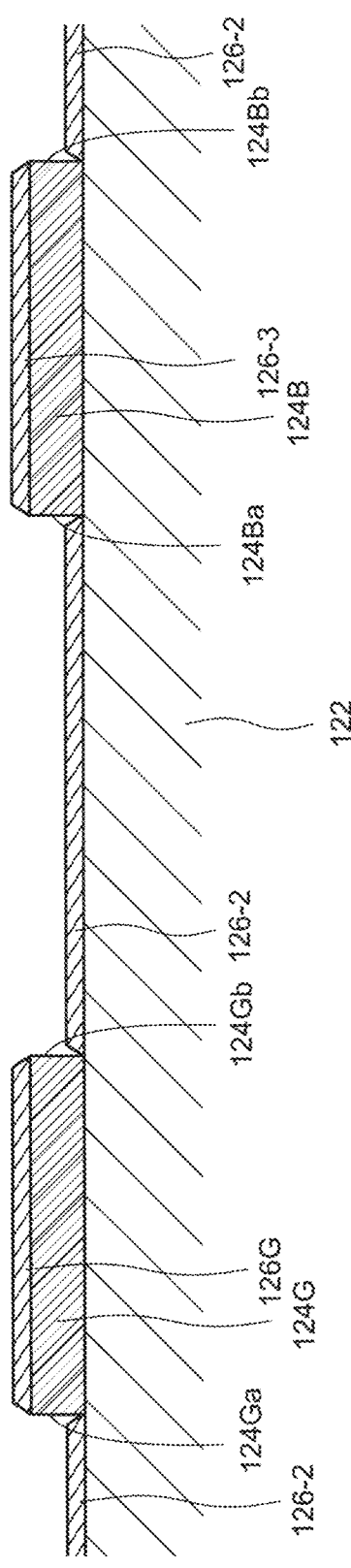
FIG. 6 is a cross-sectional view illustrating a manufacturing method of a display device according to an embodiment of the present invention.
Figure 7:
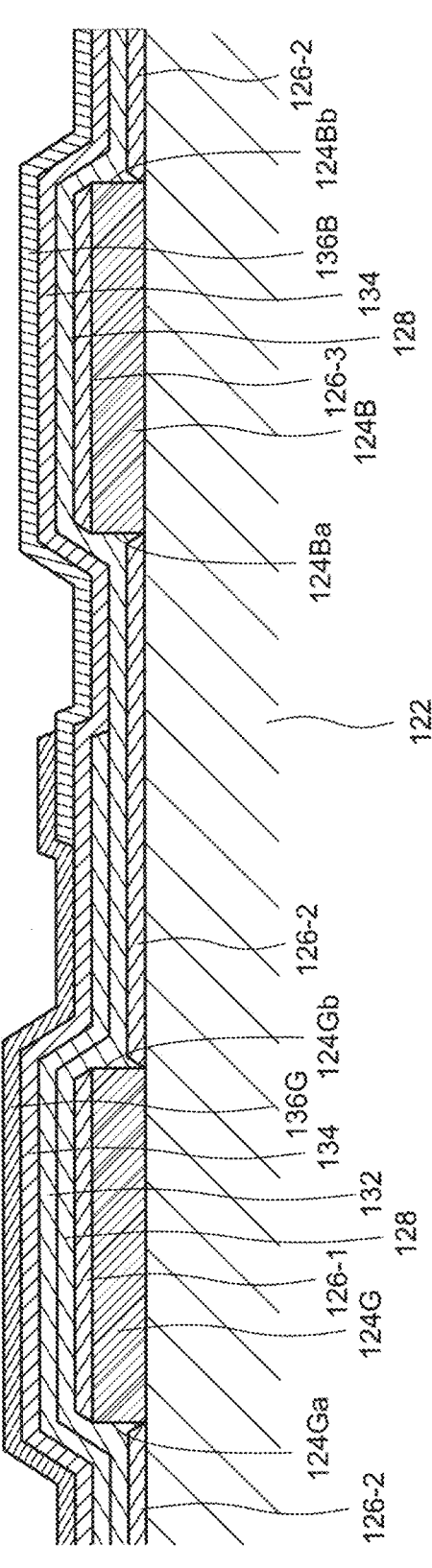
FIG. 7 is a cross-sectional view illustrating a manufacturing method of a display device according to an embodiment of the present invention.

Although not shown in FIG. 5 to FIG. 7, a transistor constituting a pixel circuit is provided on the substrate 101. Also, since a known manufacturing method of the transistor may be applied to a manufacturing method of the pixel circuit formed on the substrate 101, a detailed explanation thereof is omitted. An interlayer insulating film containing at least one of silicon oxide and silicon nitride is formed on the transistor. A source electrode and a drain electrode are formed on the interlayer insulating film.

FIG. 5 is a diagram illustrating a process of forming the insulating film 122 and the pixel electrodes 124G and 124B. The insulating film 122 functions as a flattening film. The insulating film 122 is composed of an organic resin material. A known organic resin material such as a polyimide-based, polyamide-based, acrylic-based, epoxy-based, or siloxane-based material is used as organic resin material. Providing the insulating film 122 on the transistor or the interlayer insulating film makes it possible to relieve an unevenness of the transistor. A contact hole is formed in the insulating film 122.

The pixel electrodes 124G and 124B are formed on the insulating film 122 by a vapor deposition method. For example, the film thickness of the pixel electrodes 124G and 124B is 100 nm or more and 250 nm or less. Each of the pixel electrodes 124G and 124B is electrically connected to the source electrode or the drain electrode connected to the transistor via the contact hole provided in the insulating film 122. In the present embodiment, the pixel electrodes 124G and 124B function as anodes. Highly reflective metal films are used as the pixel electrodes 124G and 124B. Alternatively, a stacked structure of a transparent conductive layer with a high-work-function such as an indium-oxide-based transparent conductive layer (e.g., ITO) or a zinc-oxide-based transparent conductive layer (e.g., IZO, ZnO) and a metal film is used as the pixel electrodes 124R, 124G, and 124B.

In the present embodiment, a conventionally used bank is omitted. Since no bank is provided, top end portions of the pixel electrodes 124G and 124B are not covered by the bank.

FIG. 6 is a diagram illustrating a process of forming the common layer 126 on the pixel electrodes 124G and 124B. The common layer 126 is formed on the pixel electrodes 124G and 124B by the vapor deposition method. For example, the film thickness of the common layer 126 is 10 nm or more and 50 nm or less. The film thickness of the common layer 126 is smaller than the film thickness of the pixel electrode 124. Therefore, in the case where the common layer 126 is formed on the pixel electrodes 124G and 124B, the common layer 126 is cut by the upper end portions of the pixel electrodes 124G and 124B. By such a simple method, the common layer 126 can be separated into the common layers 126-1 and 126-3 provided in the region overlapping the pixel electrodes 124G and 124B and the common layer 126-2 provided in the region other than the pixel electrodes 124G and 124B.

A p-type dopant is added to the common layer 126, and the molecules constituting the common layer 126 and the p-type dopant are separated from each other by an interaction to generate holes and electrons. A material having a LUMO (Lowest Unoccupied Molecular Orbital) close to a HOMO (Highest Occupied Molecular Orbital) of the common layer 126 is desirable as the p-type dopant, and for example, molybdenum oxide ($MoO_3$), rhenium oxide ($Re_2O_7$), tetrafluoro-tetracyano-quinodimethane (F4-TCNQ), hexafluoro-tetracyano-naphthoquinodimethane (F6-TCNNQ), and the like can be used.

FIG. 7 is a diagram illustrating a process of forming the common layer 128 to the light-emitting layers 136G and 136B. The common layer 128 is formed on the common layer 126 by the vapor deposition method. The common layer 128 is formed over the entire display region 102. For example, the film thickness of the common layer 128 is 50 nm or more and 100 nm or less. The film thickness of the common layer 128 is greater than the film thickness of the common layer 126. Therefore, the common layer 128 formed on the common layers 126-1 to 126-3 can be formed without being cut by the upper end portions of the common layers 126-1 and 126-3. In addition, the common layer 128 may also be formed on the side surfaces 124Ga and 124Gb of the pixel electrode 124G and the side surfaces 124Ba and 124Bb of the pixel electrode 124B. A material such as 4,4'-bis[N-(1-naphthyl)-N-phenylamino]biphenyl (NPB), 1,3-bis(N-carbazolyl)benzene), TCTA (4,4',4"-tris(carbazol-9-yl)triphenylamine (mCP) can be used as the common layer 128.

In the pixel 105G, the common layer 132 is formed in the region overlapping the pixel electrode 124G. The common layer 132 is formed to overlap the pixel electrode 124G in the pixel 105G and not formed in the pixel 105B. The film thickness of the common layer 132 is 10 nm or more and 50 nm or less. A material similar to that of the common layer 128 is used as a material of the common layer 132.

Although not shown in FIG. 7, the common layer 132 may also be provided in the region overlapping the pixel electrode 124 on which the red light-emitting element 130R is formed. Further, in the red light-emitting element 130R, a common layer serving as a hole transport layer may be provided on the common layer 132 in the region overlapping the pixel electrode 124. As a result, the relationship between the film thicknesses of the hole transport layer in the red light-emitting element 130R, the green light-emitting element 130G, and the blue light-emitting element 130B is the film thickness of the hole transport layer in the red light-emitting element 130R>the film thickness of the hole transport layer in the green light-emitting element 130G>and the film thickness of the hole transport layer in the blue light-emitting element 130B. The optical path length can be adjusted by changing the film thickness of the hole transport layer for each of the light-emitting elements 130R, 130G, and 130B. As a result, only light with a wavelength that matches the optical path length can be resonated and emphasized, and the light with a wavelength whose optical path length is shifted can be attenuated. Therefore, the spectrum of the light extracted to the outside becomes high intensity, and the brightness and the color purity are improved.

The common layer 134 is formed on the common layer 132 by the vapor deposition method. The common layer 134 is formed over the entire display region 102. The film thickness of the common layer 134 is 5 nm or more and 20 nm or less.

Next, the light-emitting layer 136G and the light-emitting layer 136B are formed on the common layer 134. First, in the pixel 105B, the light-emitting layer 136B is formed in the region overlapping the pixel electrode 124B by the vapor deposition method. Next, in the pixel 105G, the light-emitting layer 136G is formed in the region overlapping the pixel electrode 124G by the vapor deposition method. In the border region between the pixel 105G and the pixel 105B, there may be a region where the end portion of the light-emitting layer 136G and the end portion of the light-emitting layer 136B overlap.

Next, a process of forming the common layer 138 to the counter electrode 146 will be described. The common layer 138 is formed on the light-emitting layers 136G and 136B by the vapor deposition method. The common layer 138 is formed over the entire display region 102. The film thickness of the common layer 138 is 5 nm or more and 20 nm or less. Next, the common layer 142 is formed on the common layer 138 by the vapor deposition method. The common layer 142 is formed over the entire display region 102. The film thickness of the common layer 142 is 5 nm or more and 30 nm or less. Next, an electron injection layer is formed on the common layer 142 by the vapor deposition method. The common layer 144 is formed over the entire display region 102. The film thickness of the common layer 144 is 3 nm or more and 20 nm or less. Finally, the counter electrode 146 is formed on the common layer 144 by the vapor deposition method. The counter electrode 146 is formed over the entire display region 102. The film thickness of the counter electrode 146 is 5 nm or more and 30 nm or less. When the counter electrode 146 is formed of a metal material such as MgAg, the film thickness is set to the above-described level so that the light from the light-emitting layer 136 can be transmitted and extracted. If the counter electrode 146 is formed of a transparent conductive material, the film thickness of the counter electrode 146 is not limited to this and may be thicker.

Through the above-described processes, the light-emitting element 130R, the light-emitting element 130G, and the light-emitting element 130B shown in FIG. 3 and FIG. 4 can be formed in the display region 102.

In the present embodiment, although the case where the light-emitting layer 136B is formed after the light-emitting layer 136G is formed is described, although there is no limitation on the order of the formation. The order in which the light-emitting layers 136R, 136G, and 136B are formed is not particularly limited.

In the present embodiment, the bank provided between the adjacent pixel electrodes 124 can be omitted so that the processes can be omitted. In order to divide the common layer 126 into a plurality of regions, it is only necessary to cut the common layer by the upper end portion of the pixel electrode 124. A display device in which a lateral leakage current in the light-emitting element is suppressed can be manufactured by such a simple method.

(Modification 1)

In the present embodiment, although an example in which the common layer 126 is divided by the pixel electrode 124 is described, an embodiment of the present invention is not limited to this. The common layer 128 may also be divided together with the common layer 126. A display device 100A in which the common layer 128 is divided together with the common layer 126 will be described with reference to FIG. 8.

Figure 8:
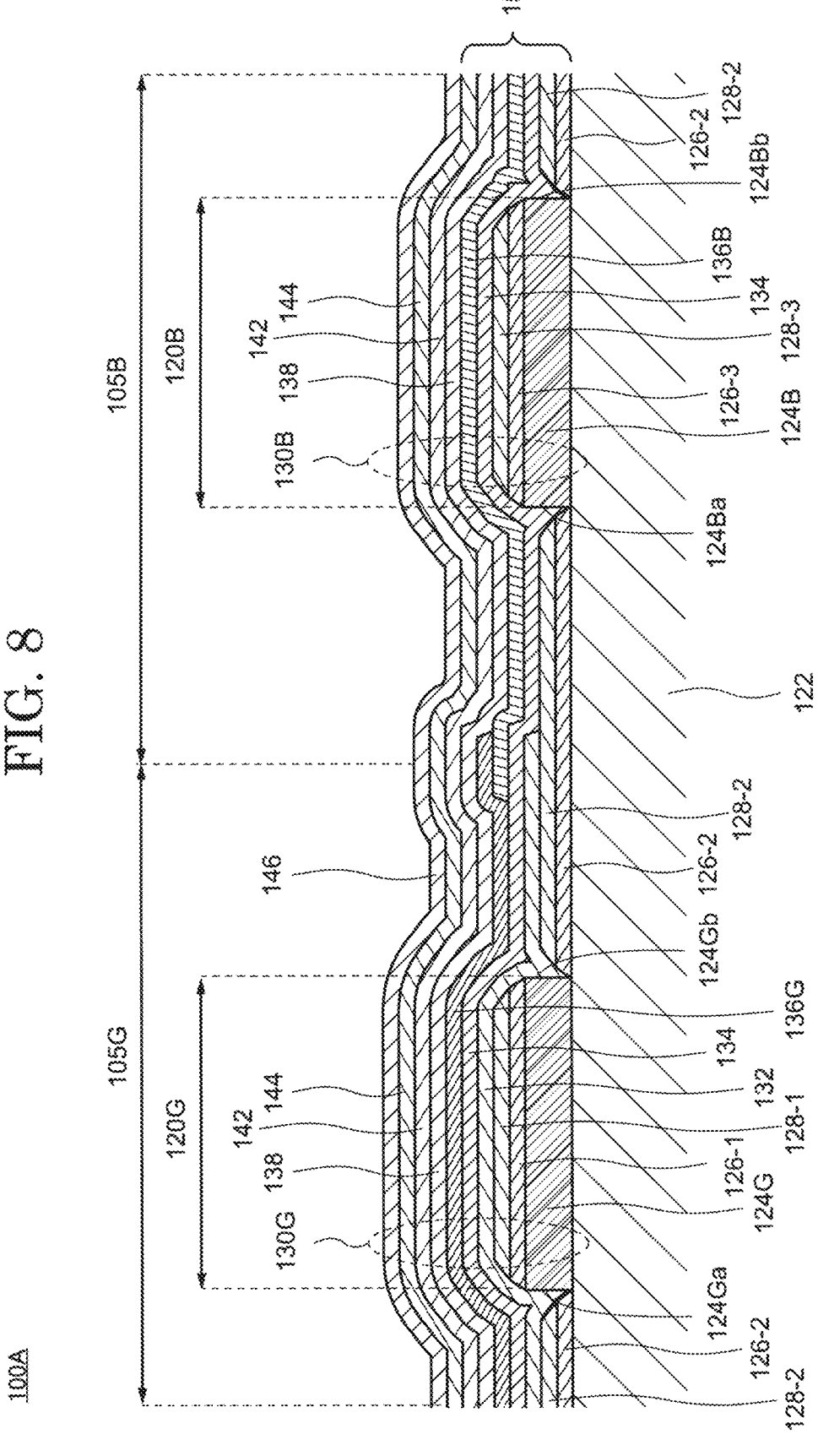
FIG. 8 is a cross-sectional view in a display region of a display device according to an embodiment of the present invention.

FIG. 8 is an enlarged cross-sectional view of the pixel 105G and the pixel 105B. In FIG. 8, the light-emitting element 130G and the light-emitting element 130B are provided above the insulating film 122.

FIG. 8 shows a state in which the common layer 128 provided on the common layers 126-1, 126-2, and 126-3 is divided. Specifically, the common layer 128 is cut by the common layers 126-1 and 126-3. Accordingly, the common layer 128 is not formed on the side surfaces 124Ga and 124Gb of the pixel electrode 124G and the side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 128 can be separated into a common layer 128-1 (also referred to as a fourth region) provided on the pixel electrode 124G, a common layer 128-3 (also referred to as a sixth region) provided on the pixel electrode 124B, and a common layer 128-2 (also referred to as a fifth region) provided between the pixel electrode 124G and the pixel electrode 124B. The region where the common layers 126-1, 126-2, and 126-3 are provided substantially coincides with the region where the common layers 128-1, 128-2, and 128-3 are provided.

In the pixel 105G, the common layer 132 is provided in the region that overlaps the pixel electrode 124G. The common layer 132 may be provided so as to be in contact with the side surfaces 124Ga and 124Gb of the pixel electrode 124G. The common layer 132 is provided on the common layer 128-2. The common layer 132 is not cut by the common layer 128-1. In addition, the common layer 134 may be provided on the common layers 128-2 and 128-3. The common layer 134 may be provided so as to be in contact with the side surfaces 124Ba and 124Bb of the pixel electrode 124B. Since the layers above the common layer 134 are as described in FIG. 4, detailed descriptions thereof will be omitted.

In FIG. 8, not only the common layer 126 but also the common layer 128 is divided. Therefore, the lateral resistance between the common layer 126, the common layer 128, and the common layer 132 increases, and the lateral resistance between the common layer 126, the common layer 128, and the common layer 134 increases. As a result, it is possible to suppress the holes from flowing from the common layer 126 and the common layer 128 to the common layer 132, and from the common layer 126 and the common layer 128 to the common layer 134. Therefore, at the border between the green pixel 105G and the blue pixel 105B, it is possible to suppress color mixing due to unintended light emission of the light-emitting layer 136G due to the light emission of the light-emitting layer 136B.

Although not shown, the common layer 132 may be divided in the green pixel 105G. In this case, the common layer 132 is cut by the common layer 128-1. Accordingly, the common layer 132 is not formed on the side surfaces 124Ga and 124Gb of the pixel electrode 124G and the side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 132 can be separated into the common layer 132 provided on the pixel electrode 124G and the common layer 132 provided between the pixel electrode 124G and the pixel electrode 124B. The common layer 132 provided on the pixel electrode 124G substantially coincides with the region where the common layer 126-1 is provided and the region where the common layer 128-1 is provided.

(Modification 2)

In the present embodiment, the pixel electrode 124 may function as a cathode, and the counter electrode 146 may function as an anode.

In FIG. 4, in the case where the pixel electrode 124 is allowed to function as a cathode, the common layer 126 (also referred to as a first common layer) is an electron injection layer, the common layer 128 is an electron transport layer, and the common layer 134 (also referred to as a second common layer) is a hole-blocking layer. In this case, the common layer 132 may be omitted. In addition, the common layer 138 provided on the light-emitting layers 136R, 136G, and 136G is an electron-blocking layer, the common layer 142 is a hole transport layer, and the common layer 144 is a hole injection layer. In this case, a common layer for adjusting the film thickness of the hole transport layer may be provided between the common layer 138 and the common layer 142.

In FIG. 8, in the case where the pixel electrode 124 is allowed to function as a cathode, the common layer 126 (also referred to as the first common layer) is an electron injection layer, the common layer 128 (also referred to as a third common layer) is an electron transport layer, and the common layer 134 (also referred to as the second common layer) is a hole-blocking layer. In this case, the common layer 132 may be omitted. In addition, the common layer 138 provided on the light-emitting layers 136R, 136G, and 136G is an electron-blocking layer, the common layer 142 is a hole transport layer, and the common layer 144 is a hole injection layer. In this case, a common layer for adjusting the film thickness of the hole transport layer may be provided between the common layer 138 and the common layer 142.

Second Embodiment

In the present embodiment, a display device 100B in which an insulating layer is provided between the pixel electrode 124G and the pixel electrode 124B will be described with reference to FIG. 9 to FIG. 11.

Figure 9:
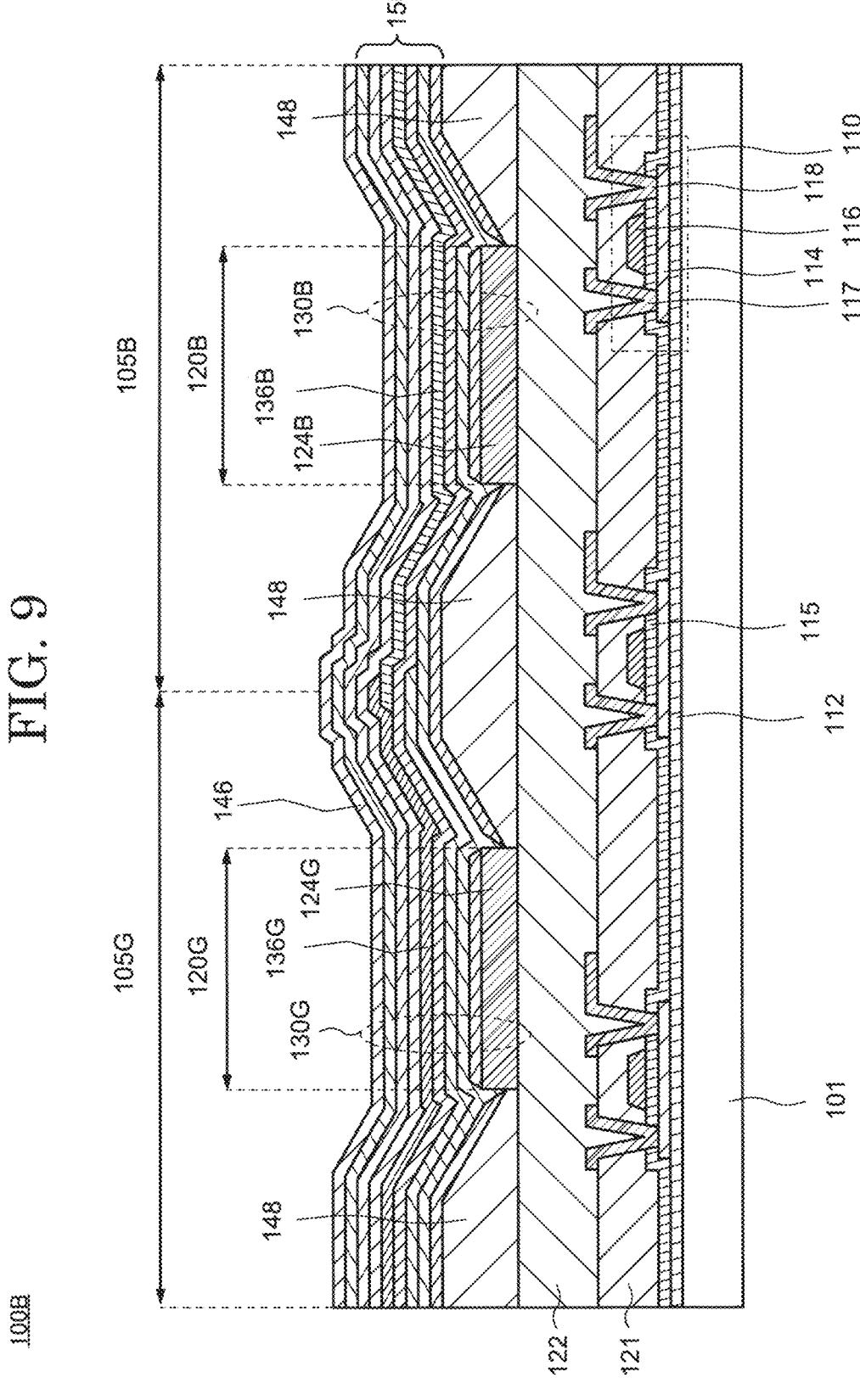
FIG. 9 is a cross-sectional view in a display region of a display device according to another embodiment of the present invention.

FIG. 9 shows a cross-sectional view of the pixel 105G and the pixel 105B. On the insulating film 122, the light-emitting element 130G is provided in the pixel 105G, and the light-emitting element 130B is provided in the pixel 105B. The light-emitting element 130G has at least the pixel electrode 124G, the light-emitting layer 136G, and the counter electrode 146. The light-emitting element 130B has at least the pixel electrode 124B, the light-emitting layer 136B, and the counter electrode 146.

Next, various layers included in the organic layer 150 will be described with reference to FIG. 10. FIG. 10 is an enlarged cross-sectional view of the pixel 105G and the pixel 105B. In FIG. 10, the light-emitting element 130G and the light-emitting element 130B are provided above the insulating film 122.

In the present embodiment, an insulating layer 148 is provided between the adjacent pixel electrode 124G and the pixel electrode 124B. The insulating layer 148 functions as a bank. An organic material is used as the insulating layer 148. The insulating layer 148 is opened to expose the upper end portions of the pixel electrode 124G and the pixel electrode 124B. A portion of the side surfaces 124Ga and 124Gb of the pixel electrode 124G and a portion of the side surfaces 124Ba and 124Bb of the pixel electrode 124B may be in contact with the insulating layer 148. The film thickness of the insulating layer 148 is 0.5 μm or more and 5 μm or less at the thickest portion.

Providing the insulating layer 148 between the adjacent pixel electrodes 124G and 124B improves the continuity from the light-emitting layers 136G and 136B to the counter electrode 146 compared to the display device 100. In addition, it is possible to suppress the counter electrode 146 from being cut.

In the display device 100 according to an embodiment of the present invention, the common layer 126 causing the lateral leakage current to flow is divided. Specifically, the common layer 126 is cut by the end portion of the pixel electrode 124. Accordingly, the common layer 126 is not formed on the side surfaces 124Ga and 124Gb of the pixel electrode 124G and the side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 126 can be separated into the common layer 126-1 provided on the pixel electrode 124G, the common layer 126-3 provided on the pixel electrode 124B, and the common layer 126-2 provided between the pixel electrode 124G and the pixel electrode 124B. That is, the common layer 126 is separated into the common layers 126-1 and 126-3 provided in the region overlapping the pixel electrodes 124G and 124B and the common layer 126-2 provided in the region not overlapping the pixel electrodes 124G and 124B.

The common layer 128 is provided on the common layers 126-1 to 126-3. The common layer 128 may continuously cover the divided common layers 126-1, 126-2, and 126-3. As shown in FIG. 9 and FIG. 10, the common layer 128 does not necessarily have to be in contact with the side surfaces 124Ga and 124Gb of the pixel electrode 124G and the side surfaces 124Ba and 124Bb of the pixel electrode 124B.

The lateral resistance of the common layers 126-1 and 126-3 and the common layer 128 increases by dividing the common layer 126 causing the lateral leakage current by the pixel electrode 124. As a result, it is possible to suppress the holes from flowing from the common layers 126-1 and 126-3 to the common layer 128. Therefore, at the border between the green pixel 105G and the blue pixel 105B, it is possible to suppress color mixing due to unintended light emission of the light-emitting layer 136G due to the light emission of the light-emitting layer 136B.

(Modification 3)

In the present embodiment, although an example in which the common layer 126 is divided by the pixel electrode 124 is described, an embodiment of the present invention is not limited to this. The common layer 128 may also be divided together with the common layer 126. A display device 100C in which the common layer 128 is divided together with the common layer 126 will be described with reference to FIG. 11.

Figure 11:
FIG. 11 is a cross-sectional view in a display region of a display device according to another embodiment of the present invention.

FIG. 11 is an enlarged cross-sectional view of the pixel 105G and the pixel 105B. In FIG. 11, the light-emitting element 130G and the light-emitting element 130B are provided above the insulating film 122.

In FIG. 11, the common layer 128 provided on the common layers 126-1, 126-2, and 126-3 is also divided. Specifically, the common layer 128 is cut by the common layers 126-1 and 126-3. Accordingly, the common layer 128 is not formed on the side surfaces 124Ga and 124Gb of the pixel electrode 124G and the side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 128 can be separated into the common layer 128-1 (also referred to as a fourth region) provided on the pixel electrode 124G, the common layer 128-3 (also referred to as the sixth region) provided on the pixel electrode 124B, and the common layer 128-2 (also referred to as the fifth region) provided between the pixel electrode 124G and the pixel electrode 124B. The region where the common layers 126-1, 126-2, and 126-3 are provided substantially coincides with the region where the common layers 128-1, 128-2, and 128-3 are provided. The common layer 128-2 is provided on the insulating layer 148.

In the pixel 105G, the common layer 132 is provided in the region that overlaps the pixel electrode 124G. The common layer 132 may be provided so as to be in contact with the side surfaces 124Ga and 124Gb of the pixel electrode 124G. In addition, the common layer 134 is provided on the common layers 128-2 and 128-3. The common layer 134 may be provided so as to be in contact with the side surfaces 124Ba and 124Bb of the pixel electrode 124B. Since the layers above the common layer 134 are as described in FIG. 4, detailed descriptions thereof will be omitted.

In FIG. 11, not only the common layer 126 but also the common layer 128 is divided. Therefore, the lateral resistance between the common layer 126, the common layer 128, and the common layer 132 increases, and the lateral resistance between the common layer 126, the common layer 128, and the common layer 134 increases. As a result, it is possible to suppress the holes from flowing from the common layer 126 and the common layer 128 to the common layer 132, and from the common layer 126 and the common layer 128 to the common layer 134. Therefore, at the border between the green pixel 105G and the blue pixel 105B, it is possible to prevent color mixing due to unintended light emission of the light-emitting layer 136G due to the light emission of the light-emitting layer 136B.

Although not shown, the common layer 132 may be divided in the green pixel 105G. In this case, the common layer 132 is cut by the common layer 128-1. Accordingly, the common layer 132 is not formed on the side surfaces 124Ga and 124Gb of the pixel electrode 124G and the side surfaces 124Ba and 124Bb of the pixel electrode 124B. Therefore, the side surfaces 124Ga and 124Gb of the pixel electrode 124G and the side surfaces 124Ba and 124Bb of the pixel electrode 124B are exposed. The common layer 132 can be separated into the common layer 132 provided on the pixel electrode 124G and the common layer 132 provided between the pixel electrode 124G and the pixel electrode 124B. The common layer 132 provided on the pixel electrode 124G substantially coincides with the region where the common layer 126-1 is provided and the region where the common layer 128-1 is provided.

(Modification 4)

In the present embodiment, the pixel electrode 124 may function as a cathode, and the counter electrode 146 may function as an anode.

Figure 10:
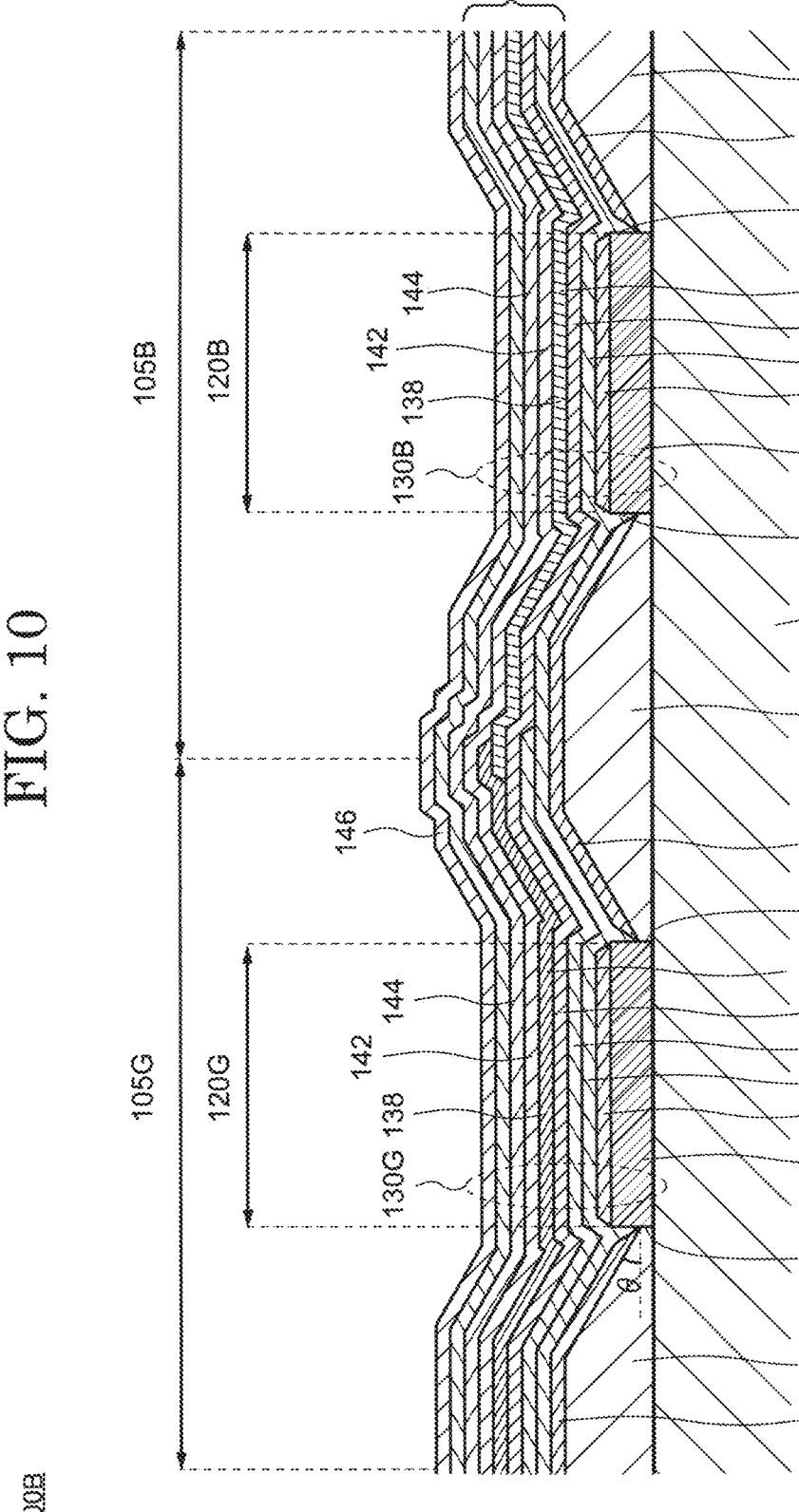
FIG. 10 is an enlarged view of a portion of the cross-sectional view shown in FIG. 9.

In FIG. 10, in the case where the pixel electrode 124 is allowed to function as a cathode, the common layer 126 (also referred to as the first common layer) is an electron injection layer, the common layer 128 is an electron transport layer, and the common layer 134 (also referred to as the second common layer) is a hole-blocking layer. In this case, the common layer 132 may be omitted. In addition, the common layer 138 provided on the light-emitting layers 136R, 136G, and 136G is an electron-blocking layer, the common layer 142 is a hole transport layer, and the common layer 144 is a hole injection layer. In this case, a common layer for adjusting the film thickness of the hole transport layer may be provided between the common layer 138 and the common layer 142.

In FIG. 11, in the case where the pixel electrode 124 is allowed to function as a cathode, the common layer 126

(also referred to as the first common layer) is an electron injection layer, the common layer 128 (also referred to as the third common layer) is an electron transport layer, and the common layer 134 (also referred to as the second common layer) is a hole-blocking layer. In this case, the common layer 132 may be omitted. In addition, the common layer 138 provided on the light-emitting layers 136R, 136G, and 136B is an electron-blocking layer, the common layer 142 is a hole transport layer, and the common layer 144 is a hole injection layer. In this case, a common layer for adjusting the film thickness of the hole transport layer may be provided between the common layer 138 and the common layer 142.

(Modification 5)

The display devices 100 and 100A according to an embodiment of the present invention are not limited to the structures shown in FIG. 2 to FIG. 4. For example, the arrangement of the pixels 105R, 105G, and 105B is not limited to a stripe arrangement. For example, it may be a so-called pentile arrangement in which a set of one red pixel 105R, one blue pixel 105B, and two green pixels 105G constitute a unit pixel.

As described above, the display device according to an embodiment of the present invention can be applied to various embodiments. Therefore, the addition, deletion, or design change of components, or the addition, deletion, or condition change of processes as appropriate by those skilled in the art based on the display devices 100 and 100A to 100C described as the embodiment and modifications of the invention are also included in the scope of the present invention as long as they are provided with the gist of the present invention. Further, each of the embodiments described above as an embodiment of the present invention can be appropriately combined and implemented as long as no contradiction is caused.

Although the above-described embodiment mainly describes a display device having an organic EL element as a display element that suppresses a leakage current in the organic layer, the present invention is applicable not only to a display device but also to an optical sensor device or the like configured by arranging an organic photodiode in which an organic layer is sandwiched between electrodes in a matrix. Specifically, the present invention can be applied to an end portion overlapping relationship of the organic layer constituting the organic photodiode.

Further, it is understood that, even if the advantageous is different from those provided by each of the above-described embodiments, the advantageous obvious from the description in the specification or easily predicted by persons ordinarily skilled in the art is apparently derived from the present invention.

Within the scope of the present invention, it is understood that various modifications and changes can be made by those skilled in the art and that these modifications and changes also fall within the scope of the present invention. For example, the addition, deletion, or design change of components, or the addition, deletion, or condition change of processes as appropriate by those skilled in the art based on each embodiment are also included in the scope of the present invention as long as they are provided with the gist of the present invention.

What is claimed is:

1. A display device comprising:

a first pixel electrode;

a second pixel electrode spaced apart from the first pixel electrode in a first direction;

a first common layer provided on each of the first pixel electrode and the second pixel electrode;

a second common layer provided on the first common layer;

a first light-emitting layer provided on the first pixel electrode via the first common layer and the second common layer;

a second light-emitting layer provided on the second pixel electrode via the first common layer and the second common layer; and a counter electrode provided on the first light-emitting layer and the second light-emitting layer, wherein the first common layer has a first region overlapping the first pixel electrode, a second region between the first pixel electrode and the second pixel electrode, and a third region overlapping the second pixel electrode, the second region is separated from each of the first region and the third region, the second common layer continuously covers the first region, the second region, and the third region, the second common layer is in direct contact with the first pixel electrode and the second pixel electrode, each of the first pixel electrode and the second pixel electrode includes an upper surface in direct contact with the first common layer and facing the counter electrode, a lower surface on an opposite side of the upper surface, a side surface connecting the upper surface to the lower surface, and the second common layer is in direct contact with the side surface of the first pixel electrode and the side surface of the second pixel electrode.

2. The display device according to claim 1, wherein the first pixel electrode and the second pixel electrode are anodes, the first common layer is a hole injection layer, the second common layer is a hole transport layer, and the counter electrode is a cathode.

3. The display device according to claim 1, wherein the first pixel electrode and the second pixel electrode are cathodes, the first common layer is an electron injection layer, the second common layer is an electron transport layer, and the counter electrode is an anode.

4. The display device according to claim 1, further comprising:

a third common layer provided between the first common layer and the second common layer, wherein the third common layer has a fourth region overlapping the first region, a fifth region overlapping the second region, and a sixth region overlapping the third region, and the fifth region is separated from each of the fourth region and the sixth region.

5. The display device according to claim 4, wherein the first pixel electrode and the second pixel electrode are anodes, the first common layer is a hole injection layer, the second common layer is an electron-blocking layer, the third common layer is a hole transport layer, and the counter electrode is a cathode.

6. The display device according to claim 4, wherein the first pixel electrode and the second pixel electrode are cathodes, the first common layer is an electron injection layer, the second common layer is a hole-blocking layer, the third common layer is an electron transport layer, and the counter electrode is an anode.

7. The display device according to claim 1, wherein each of the first pixel electrode and the second pixel electrode includes an upper surface in direct contact with the first common layer and facing the counter electrode, the second region of the first common layer is not in direct contact with the upper surface of the first pixel electrode, and the second region of the first common layer is not in direct contact with the upper surface of the second pixel electrode.

8. The display device according to claim 1, wherein each of the first pixel electrode and the second pixel electrode includes an upper surface in direct contact with the first common layer and facing the counter electrode, an entirety of the upper surface of the first pixel electrode is in direct contact with the first region of the first common layer, and an entirety of the upper surface of the second pixel electrode is in direct contact with the third region of the first common layer.

9. The display device according to claim 1, wherein the second region of the first common layer does not overlap the first pixel electrode and the second pixel electrode.

10. A display device comprising:

a first pixel electrode;

a second pixel electrode spaced apart from the first pixel electrode in a first direction;

an insulating layer between the first pixel electrode and the second pixel electrode;

a first common layer provided on each of the first pixel electrode, the second pixel electrode, and the insulating layer;

a second common layer provided on the first common layer;

a first light-emitting layer provided on the first pixel electrode via the first common layer and the second common layer;

a second light-emitting layer provided on the second pixel electrode via the first common layer and the second common layer; and a counter electrode provided on the first light-emitting layer and the second light-emitting layer, wherein the first common layer has a first region overlapping the first pixel electrode, a second region on the insulating layer, and a third region overlapping the second pixel electrode, the second region is separated from each of the first region and the third region, the insulating layer contacts a portion of a side surface of the first pixel electrode and a portion of a side surface of the second pixel electrode, the second common layer continuously covers the first region, the second region, and the third region, the insulating layer does not overlap the first pixel electrode or the second pixel electrode, each of the first pixel electrode and the second pixel electrode includes an upper surface in direct contact with the first common layer and facing the counter electrode, a lower surface on an opposite side of the upper surface, a side surface connecting the upper surface to the lower surface, and the second common layer is in direct contact with the side surface of the first pixel electrode and the side surface of the second pixel electrode.

11. The display device according to claim 10, wherein the first pixel electrode and the second pixel electrode are anodes, the first common layer is a hole injection layer, the second common layer is a hole transport layer, and the counter electrode is a cathode.

12. The display device according to claim 10, wherein the first pixel electrode and the second pixel electrode are cathodes, the first common layer is an electron injection layer, the second common layer is an electron transport layer, and the counter electrode is an anode.

13. The display device according to claim 10, further comprising:

a third common layer provided between the first common layer and the second common layer, wherein the third common layer has a fourth region overlapping the first region, a fifth region overlapping the second region, and a sixth region overlapping the third region, and the fifth region is separated from each of the fourth region and the sixth region.

14. The display device according to claim 13, wherein the first pixel electrode and the second pixel electrode are anodes, the first common layer is a hole injection layer, the second common layer is an electron-blocking layer, the third common layer is a hole transport layer, and the counter electrode is a cathode.

15. The display device according to claim 13, wherein the first pixel electrode and the second pixel electrode are cathodes, the first common layer is an electron injection layer, the second common layer is a hole-blocking layer, the third common layer is an electron transport layer, and the counter electrode is an anode.

16. The display device according to claim 10, wherein each of the first pixel electrode and the second pixel electrode includes an upper surface in direct contact with the first common layer and facing the counter electrode, the second region of the first common layer is not in direct contact with the upper surface of the first pixel electrode, and the second region of the first common layer is not in direct contact with the upper surface of the second pixel electrode.

17. The display device according to claim 10, wherein each of the first pixel electrode and the second pixel electrode includes an upper surface in direct contact with the first common layer and facing the counter electrode, an entirety of the upper surface of the first pixel electrode is in direct contact with the first region of the first common layer, and an entirety of the upper surface of the second pixel electrode is in direct contact with the third region of the first common layer.

18. The display device according to claim 10, wherein the second region of the first common layer does not overlap the first pixel electrode and the second pixel electrode.

* * * * *